(12) United States Patent
Kinoshita

(10) Patent No.: US 8,669,189 B2
(45) Date of Patent: Mar. 11, 2014

(54) METHOD FOR TREATING A SEMICONDUCTOR WAFER

(75) Inventor: Kei Kinoshita, Villach (AT)

(73) Assignee: Lam Research AG, Villach (AT)

( * ) Notice: Subject to any disclaimer, the term of this patent is extended or adjusted under 35 U.S.C. 154(b) by 76 days.

(21) Appl. No.: 13/380,294

(22) PCT Filed: Jun. 14, 2010

(86) PCT No.: PCT/IB2010/052649
§ 371 (c)(1),
(2), (4) Date: Dec. 22, 2011

(87) PCT Pub. No.: WO2010/150135
PCT Pub. Date: Dec. 29, 2010

(65) Prior Publication Data
US 2012/0108074 A1 May 3, 2012

(30) Foreign Application Priority Data

Jun. 25, 2009 (AT) .................... A 988/2009

(51) Int. Cl.
*H01L 21/306* (2006.01)
*B44C 1/22* (2006.01)
(52) U.S. Cl.
USPC ............ 438/745; 216/83; 134/2; 134/3
(58) Field of Classification Search
USPC ............ 438/745; 216/83; 134/2, 3
See application file for complete search history.

(56) References Cited

U.S. PATENT DOCUMENTS

| 7,250,114 | B2 * | 7/2007 | Kiehlbauch et al. ........... 216/31 |
| 8,222,149 | B2 * | 7/2012 | Chang ........................ 438/700 |
| 8,349,739 | B2 * | 1/2013 | Chang ........................ 438/689 |
| 2003/0033676 | A1 * | 2/2003 | DeYoung et al. ............... 8/158 |
| 2004/0185627 | A1 | 9/2004 | Brask |
| 2005/0239673 | A1 | 10/2005 | Hsu |

FOREIGN PATENT DOCUMENTS

JP     2005227749     8/2005

OTHER PUBLICATIONS

International Search Report dated Feb. 10, 2011, in PCT application.

* cited by examiner

*Primary Examiner* — Shamim Ahmed
(74) *Attorney, Agent, or Firm* — Young & Thompson

(57) ABSTRACT

Disclosed is a method for treating semiconductor wafer including:
  providing a layer that contains lanthanum oxide or a lanthanide oxide (e.g. $Dy_2O_3$, $Pr_2O_3$, $Ce_2O_3$)
  applying an aqueous solution, wherein the aqueous solution is carbonated water, whereby the layer that contains lanthanum oxide or a lanthanide oxide is removed at specific areas, so that the surface, on which the layer that contains lanthanum oxide or a lanthanide oxide has been deposited, is exposed.

14 Claims, 1 Drawing Sheet

METHOD FOR TREATING A SEMICONDUCTOR WAFER

TECHNICAL FIELD

The invention refers to a method for treating a semiconductor wafer.

More specifically it refers to a method for wet treatment of a semiconductor wafer, wherein a layer comprising lanthanum oxide or a lanthanide oxide is selectively etched against a layer, on which it has been deposited, in order to expose the underlying layer.

BACKGROUND

FIG. 1 shows schematic cross-sectional view of a high-k metal gate stack 1 before a method according to an embodiment of the invention is applied. On the bulk silicon 10 of a silicon wafer a number of layers are deposited in this order:

TABLE 1

| reference number | material | thickness |
| --- | --- | --- |
| 20 | hafnium oxide as high-k material | 1-5 nm |
| 30 | lanthanum oxide as cap-layer | 0.2-2 nm |
| 40 | Titanium nitride as metal-layer | 2-50 nm |
| 50 | polycrystalline silicon as silicon layer | 20-100 nm |
| 60 | silicon nitride as hard mask | 60 nm |

Before depositing the high-k material an interfacial layer ((silicon oxide or silicon oxynitride)) can be optionally deposited at a thickness of up to 1 nm.

Alternatively to the hafnium oxide 20 other materials with a dielectric constant k of greater than 10 (k>10) can be deposited. Suitable materials are e.g. hafnium silicates, zirconium oxides, hafnium silicon oxy nitrides, zirconium silicates, hafnium aluminates, zirconium aluminates, or combinations thereof.

Alternatively to the lanthanum oxide 30 other cap layer materials can be used such as a lanthanide oxide (such as dysprosium oxide).

Alternatively to the titanium nitride as a metal layer other titanium-based or tantalum-based materials or other materials can be used.

Alternatively to the polycrystalline silicon other silicon layers can be used such as amorphous silicon.

Alternatively to the silicon nitride as a hard mask silicon oxide can be used.

Examples for such stacks are described in S. Kubicek et al, IEDM Tech. Dig., p. 49, 2007 and A. Toriumi et al, IEDM Tech. Dig., p. 53, 2007.

A photolithography step is carried out to expose the stack where the stack layers shall be removed in order to expose the bulk silicon. The to-be-removed areas are treated with a plasma process wherein boron chloride and argon are supplied to the plasma chamber. In the to-be-removed areas (where no photo-resist is present) the silicon nitride layer 60, the polycrystalline silicon layer 50 and the titanium nitride layer 40 are generally removed. The lanthanum oxide layer 30 and the high-k layer 20 are modified by the plasma treatment so that modified lanthanum oxide 25 and modified high-k material 35 is generated (see FIG. 1). During the plasma treatment residues are generated. The carbon-rich residues 75 (deriving from photo resist) remain on top of the hard mask 60. Sidewall residues remain on the sidewall of the etched stack, which are basically metal-enriched residues 45 adhering on the sidewall and silicon-enriched residues 55 adhering on the metal-enriched residues.

It is an object of the invention to provide an easy controllable process to selectively remove lanthanum oxide of lanthanide oxide, on which no metal layer 40 or silicon layer 50 remains, and leave a clean structure without undercut of high-k or metal layers. Any attack of other materials such as hafnium or zirconium containing oxides (as high-k materials) and materials exposed at other areas of the structure such as aluminium oxide shall be prevented as far as possible.

DISCLOSURE OF INVENTION

The invention solves the problems by providing a method for treating semiconductor wafer comprising:
  providing a layer that contains lanthanum oxide or a lanthanide oxide (e.g. $Dy_2O_3$, $Pr_2O_3$, $Ce_2O_3$).
  applying an aqueous solution, wherein the aqueous solution is carbonated water, whereby the layer that contains lanthanum oxide or a lanthanide oxide is removed at specific areas, so that the surface, on which the layer that contains lanthanum oxide or a lanthanide oxide has been deposited, is exposed.

In other words the lanthanum oxide or lanthanide oxide layer is opened in order to expose the underlying material (e.g. a high-k material). Such specific areas may be areas where no mask (e.g. photo resist or hard mask) is present.

Carbonated water, also known as soda water, can be produced by "charging" a refillable seltzer bottle by filling it with water and then adding carbon dioxide. Alternatively carbon dioxide can be added to a water line (preferably DI-water line) at a certain pressure. The higher the carbon dioxide partial pressure of the pressurized gas the higher the analytical concentration of the carbon dioxide in the solution will be. The analytical concentration of carbon dioxide will be the sum of dissolved carbon dioxide free (dispersed, non-dissolved) carbon dioxide, carbonic acid and hydrogen carbonate.

This technique utilizing a carbonated water provides the advantage that it is highly selective towards the underlying material even if the underlying material has similar chemical properties. This method provides selective etching of lanthanum oxide or lanthanide oxide not only against high-k materials but also against other materials such as TaN and TiN. Furthermore carbonated water is easy to mix, environmentally friendly, and harmless.

In a preferred method the carbonated water is generated by mixing water with a resistivity (specific electrical resistance) of less than 100 kOhm meter. In this embodiment the etch rate is even higher without significantly reducing the selectivity.

In an embodiment of the invention a method is provided wherein the lanthanum oxide or the lanthanide oxide has been deposited on a layer comprising a material (high-k material different from the etched material) selected from a group consisting of hafnium oxide, zirconium oxide, hafnium silicate ($HfSiO_x$), hafnium aluminate ($HfAlO_x$), hafnium silicon oxy nitride (HfSiON), hafnium aluminium oxy nitride (HfAlON), zirconium silicate (ZrSiO), ZrAlO, zirconium silicon oxy nitride (ZrSiON), zirconium aluminium oxy nitride (ZrAlON), alumina ($Al_2O_3$), hafnium oxy nitride (HfON), and zirconium oxy nitride (ZrON).

Advantageously the analytical concentration of carbon dioxide in the aqueous solution is at least 0.1 g/l.

Preferably the pH value of the solution is selected lower than 5.5 more preferably lower than 5, which improves selectivity and etch rate. A preferred range for pH-value is between 3.5 and 4.5.

In a preferred method carbon dioxide is added to water (preferably DI-water with a resistivity of more than 100 kOhm meter) at a partial pressure of at least 1.2 bar (at least 0.2 bar gauge). The higher the carbon dioxide partial pressure of the pressurized gas, the higher the analytical concentration of the carbon dioxide in the solution will be.

MODES(s) FOR CARRYING OUT THE INVENTION

A preferred method is carried out as follows:
Starting with the stack as above-described in section "Background Art" the wet treatment method is carried out by means of a spin processor where liquid is pored onto the rotating wafer.
  $1^{st}$ Step SA: a liquid, which is an aqueous solution of ammonia ($c_{HCl}$=2 g/l) and hydrogen peroxide ($c_{NH3}$=3 g/l), is supplied at 25° C. for 30 s at 100 rpm, thereafter spun of at 300 rpm.
  Intermediate rinsing step: deionised water is supplied for 20 s at a 25° C. while the wafer is rotated at 100 rpm, thereafter the liquid is spun of at 300 rpm.
  $2^{nd}$ Step SB: deionised water at a flow of 2 l/min, to which carbon dioxide has been added at a gas-flow of 23 ml/min (at 1.5 bar and 20° C.), is supplied at 20° C. for 30 s at 100 rpm, thereafter spun of at 300 rpm. The generated carbonated water has a pH-value of 4.0, with a calculated $CO_2$-concentration of 0.03 mol/l (1.32 g/l $CO_2$ in water). Considering a saturation-concentration of 2 g/l (at 1.5 bar and 20° C.) this means that the analytical concentration is about ⅔ of the respective saturation-concentration.
  $3^{rd}$ Step SC: liquid C, which is an aqueous solution of hydrofluoric acid ($c_{HF}$=1 g/l) and hydrochloric acid ($c_{HCl}$=40 g/l), is supplied at 40° C. for 30 s at 100 rpm, thereafter spun off at 300 rpm.
  Intermediate rinsing step: deionised water is supplied for 20 s at a 25° C. while the wafer is rotated at 100 rpm, thereafter the liquid is spun off at 300 rpm.
  $4^{th}$ Step: liquid D, which is an aqueous solution of hydrogen chloride ($c_{HCl}$=2 g/l), is supplied at 25° C. for 30 s at 100 rpm, thereafter spun of at 300 rpm.
  Final rinsing step: deionised water is supplied for 20 s at a 25° C. while the wafer is rotated at 100 rpm, thereafter the liquid is spun off at 300 rpm.
  Drying with $N_2$, which is blown onto the substrate.

Figure 1:
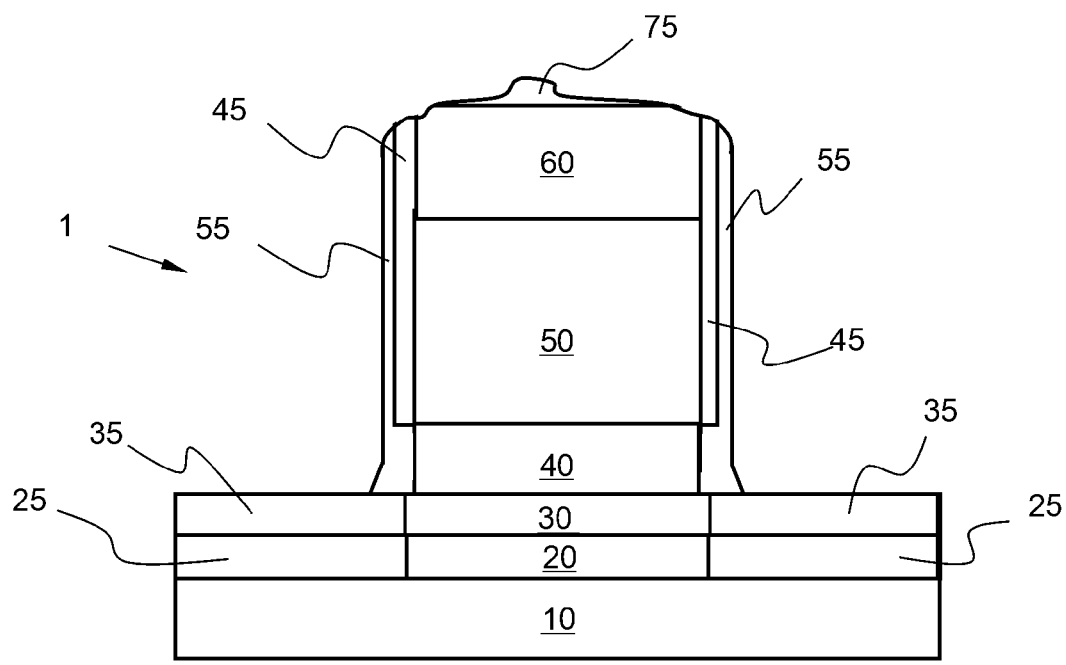
FIG. 1 shows schematic cross-sectional view of a high-k metal gate stack before a method according to an embodiment of the invention is applied.
Figure 2:
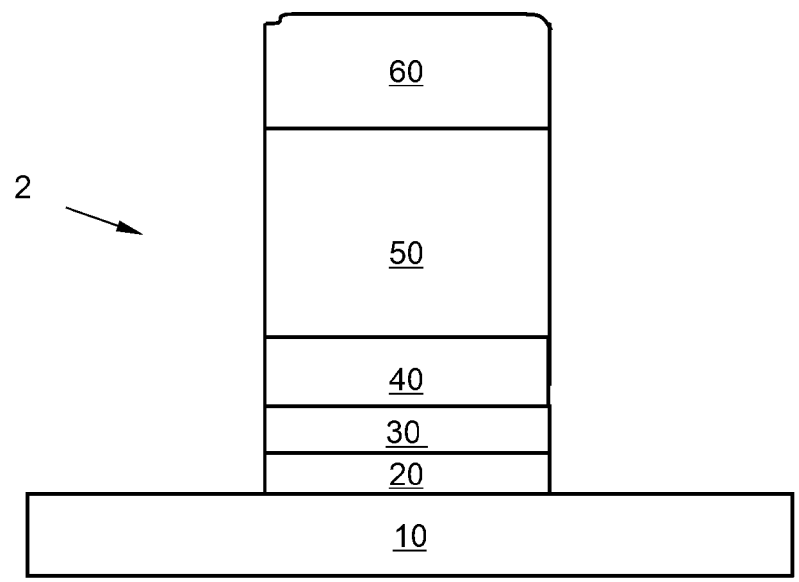
FIG. 2 shows schematic cross-sectional view of a high-k metal gate stack after a method according to an embodiment of the invention has been applied.

After this process not only the modified layers (modified cap-layer 35, modified high-k layer) are removed but also the stack structure is cleaned from all residues as shown in FIG. 2.

Although this invention is described by example of a high-k metal gate nMOS stack it shall be understood that this invention can be used whenever lanthanum oxide and/or a lanthanide oxide shall be etched and/or removed.

The invention claimed is:

1. A method for treating a semiconductor wafer comprising:
  providing a layer that contains lanthanum oxide or a lanthanide oxide overlying a layer of high-k dielectric material,
  forming a metal layer overlying the layer that contains lanthanum oxide or a lanthanide oxide,
  patterning the metal layer so as to expose the layer that contains lanthanum oxide or a lanthanide oxide in areas where the metal layer is selectively removed,
  applying an aqueous solution, wherein the aqueous solution is carbonated water, whereby the layer that contains lanthanum oxide or a lanthanide oxide is selectively removed at the areas from which the metal layer was selectively removed, thereby to expose a surface underlying the layer that contains lanthanum oxide or a lanthanide oxide.

2. Method according to claim 1 wherein the carbonated water is generated by mixing water with a resistivity (specific electrical resistance) of less than 100 kOhm meter.

3. Method according to claim 1 wherein the lanthanum oxide or the lanthanide oxide has been deposited on a layer comprising a material selected from a group consisting of hafnium oxide, zirconium oxide, hafnium silicate ($HfSiO_x$), hafnium aluminate ($HfAlO_x$), hafnium silicon oxy nitride (HfSiON), hafnium aluminium oxy nitride (HfAlON), zirconium silicate (ZrSiO), $ZrAlO_x$, zirconium silicon oxy nitride (ZrSiON), zirconium aluminium oxy nitride (ZrAlON), alumina ($Al_2O_3$), hafnium oxy nitride (HfON), and zirconium oxy nitride (ZrON).

4. Method according to claim 1 wherein the analytical concentration of carbon dioxide in the aqueous solution is at least 0.1 g/l.

5. Method according to claim 1 wherein the pH value of the solution is not more than 5.5.

6. Method according to claim 5 wherein the pH value of the solution is not more than 5.

7. Method according to claim 1 wherein the pH value of the solution is at least 3.

8. Method according to claim 7 wherein the pH value of the solution is at least 3.5.

9. Method according to claim 1 wherein carbon dioxide is added to water at a pressure of at least 1.2 bar.

10. Method according to claim 1, wherein remaining portions of the metal layer and the layer that contains lanthanum oxide or a lanthanide oxide are present within high-k metal gate nMOS stacks of semiconductor devices formed on the wafer.

11. Method according to claim 1, wherein selective removal of the layer that contains lanthanum oxide or a lanthanide oxide exposes underlying regions of the layer of high-k dielectric material, and wherein the method further comprises removing the exposed regions of the layer of high-k dielectric material so as to expose an underlying layer.

12. Method according to claim 1, wherein patterning the metal layer comprises forming a patterned photoresist layer overlying the metal layer.

13. Method according to claim 1, wherein patterning the metal layer comprises also patterning a silicon layer overlying the metal layer.

14. Method according to claim 13, wherein patterning the metal layer comprises also patterning a hard mask layer overlying the silicon layer.

* * * * *